United States Patent
Dhanyakumar et al.

(10) Patent No.: US 9,653,545 B2
(45) Date of Patent: May 16, 2017

(54) MOSFET STRUCTURE WITH T-SHAPED EPITAXIAL SILICON CHANNEL

(71) Applicant: TAIWAN SEMICONDUCTOR MANUFACTURING CO., LTD., Hsin-Chu (TW)

(72) Inventors: Mahaveer Sathaiya Dhanyakumar, Hsinchu (TW); Wei-Hao Wu, Hsinchu (TW); Tsung-Hsing Yu, Taipei (TW); Chia-Wen Liu, Taipei (TW); Tzer-Min Shen, Hsinchu (TW); Ken-Ichi Goto, Hsin-Chu (TW); Zhiqiang Wu, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 8 days.

(21) Appl. No.: 14/661,237

(22) Filed: Mar. 18, 2015

(65) Prior Publication Data

US 2015/0194485 A1 Jul. 9, 2015

Related U.S. Application Data

(63) Continuation of application No. 13/288,189, filed on Nov. 3, 2011, now Pat. No. 9,000,526.

(51) Int. Cl.
*H01L 29/06* (2006.01)
*H01L 29/10* (2006.01)
(Continued)

(52) U.S. Cl.
CPC .... *H01L 29/0653* (2013.01); *H01L 21/76232* (2013.01); *H01L 29/105* (2013.01);
(Continued)

(58) Field of Classification Search
None
See application file for complete search history.

(56) References Cited

U.S. PATENT DOCUMENTS 6,482,714 B1 * 11/2002 Hieda ............... H01L 21/28061
257/E21.2
6,746,933 B1 * 6/2004 Beintner ........... H01L 21/76224
257/E21.546
(Continued)

FOREIGN PATENT DOCUMENTS

CN 1851930 A 10/2006

*Primary Examiner* — Michael Lebentritt
*Assistant Examiner* — Jordan Klein
(74) *Attorney, Agent, or Firm* — Duane Morris LLP

(57) ABSTRACT

A MOSFET disposed between shallow trench isolation (STI) structures includes an epitaxial silicon layer formed over a substrate surface and extending over inwardly extending ledges of the STI structures. The gate width of the MOSFET is therefore the width of the epitaxial silicon layer and greater than the width of the original substrate surface between the STI structures. The epitaxial silicon layer is formed over the previously doped channel and is undoped upon deposition. A thermal activation operation may be used to drive dopant impurities into the transistor channel region occupied by the epitaxial silicon layer but the dopant concentration at the channel location where the epitaxial silicon layer intersects with the gate dielectric, is minimized.

20 Claims, 7 Drawing Sheets

(51) Int. Cl.
*H01L 29/167* (2006.01)
*H01L 29/78* (2006.01)
*H01L 29/66* (2006.01)
*H01L 21/762* (2006.01)
*H01L 21/265* (2006.01)

(52) U.S. Cl.
CPC ...... *H01L 29/1033* (2013.01); *H01L 29/1045* (2013.01); *H01L 29/1095* (2013.01); *H01L 29/167* (2013.01); *H01L 29/6659* (2013.01); *H01L 29/66492* (2013.01); *H01L 29/66651* (2013.01); *H01L 29/78* (2013.01); *H01L 21/26586* (2013.01); *H01L 29/7833* (2013.01)

(56) References Cited

U.S. PATENT DOCUMENTS

| | | |
|---|---|---|
| 6,787,423 B1* | 9/2004 | Xiang ............... H01L 21/76232 257/E21.549 |
| 7,425,751 B2 | 9/2008 | Balasubramanian et al. |
| 7,745,904 B2* | 6/2010 | Ko ................... H01L 21/76232 257/510 |
| 2004/0070023 A1 | 4/2004 | Kim et al. |
| 2005/0062103 A1* | 3/2005 | Chen .................. H01L 29/7833 257/336 |
| 2005/0130361 A1* | 6/2005 | Balasubramanian H01L 29/1054 438/197 |
| 2006/0001121 A1 | 1/2006 | Jeon |
| 2006/0022299 A1* | 2/2006 | Seo ................. H01L 21/823481 257/510 |
| 2006/0231874 A1 | 10/2006 | Popp et al. |
| 2006/0231918 A1* | 10/2006 | Popp ................ H01L 21/76229 257/510 |
| 2009/0146263 A1* | 6/2009 | Chen ................ H01L 29/66651 257/627 |
| 2010/0258872 A1 | 10/2010 | Sugii et al. |
| 2012/0032254 A1 | 2/2012 | Yang et al. |
| 2013/0256796 A1* | 10/2013 | Sathaiya et al. .. H01L 29/66537 257/344 |
| 2015/0263171 A1* | 9/2015 | Hsu .................. H01L 21/30608 257/77 |

* cited by examiner

MOSFET STRUCTURE WITH T-SHAPED EPITAXIAL SILICON CHANNEL

CROSS-REFERENCE TO RELATED APPLICATIONS

This application is a continuation of U.S. patent application Ser. No. 13/288,189, filed Nov. 3, 2011, which is incorporated by reference herein in its entirety.

BACKGROUND

This disclosure relates to semiconductor devices and manufacturing methods for the same. MOSFET, Metal Oxide Semiconductor Field Effect Transistor, devices are highly utilized components in integrated circuit and other semiconductor devices. MOSFETs are used for amplifying or switching electronic signals and provide functionality to the devices. MOSFETs that include n-type transistor channels are referred to as n-MOSFETs and MOSFETs that include p-type transistor channels are referred to as p-MOSFETs. MOSFETs may be formed using various techniques and materials but require accurate and precise placement of their various components and constituents. One of the constituents is dopant impurities that are introduced into various components of the MOSFET such as the gate structure, the source and drain regions and the transistor channel. The characteristics of the dopant impurities in each of the aforementioned structures such as the location and concentration, must be carefully controlled.

Heavily doped transistor channels have been favored in the rapidly advancing semiconductor manufacturing industry because they enable transistors to operate at higher speeds. Conventional MOSFET devices, however, suffer from random dopant fluctuations due to the heavily doped transistor channels. It would therefore be desirable to correct this shortcoming of the conventional technology.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides a MOSFET having a channel region formed of an epitaxial silicon layer disposed on a substrate and according to one advantageous embodiment, the dopant profile of the transistor channel includes the epitaxial silicon layer being an undoped layer with the channel dopant impurities species residing in the semiconductor substrate beneath the epitaxial silicon layer. The transistor further includes an increased effective gate width provided by a T-shaped cross section in which a part of the epitaxial silicon layer forming the channel, overlies a submerged ledge of an STI, shallow trench isolation, structure such that the transistor channel width is larger than the minimum distance between bookend STI structures.

Figure 1:
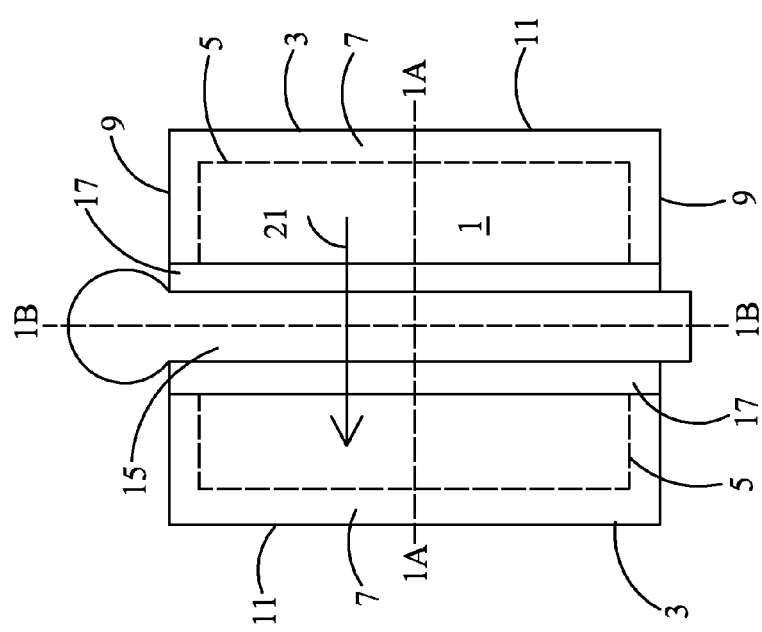
FIG. 1 is a top, plan view of an exemplary MOSFET according to the disclosure.

FIG. 1 is a top, plan view showing transistor area 1. Transistor area 1 is defined by boundaries 3. Transistor area 1 may be occupied by an epitaxial silicon layer that extends to boundaries 3 and includes edge portions 7 that overhang and extend over subjacent ledges formed in adjacent STI, shallow trench isolation, structures. Inner edges 5 are identified by the dashed line which indicates the inwardly extending edge of the ledge of the STI structure as will be shown more clearly in FIG. 1A. Transistor area 1 is defined, in the exemplary embodiment illustrated in FIG. 1, by opposed ends 9 and opposed ends 11. Opposed ends 9 are parallel to one another and generally orthogonal to opposed ends 11 but this is intended to be exemplary only and in various other exemplary embodiments, transistor area 1 may take on various other quadrilateral or other geometric shapes. Gate electrode 15 and spacers 17 form elements of a transistor formed in transistor area 1 and having a transistor channel with channel length direction 21.

Although transistor area 1 is illustrated to include edge portions 7 along each of opposed sets of edges 9 and 11, such is intended to be exemplary only and in other exemplary embodiments, the edge portions 7 that may overhang a ledge of an STI structure and extend past inner edges 5, may be present in less than all four of the opposed edges. In one exemplary embodiment, edge portions 7 may be present only along the transistor channel length direction 21 or they may be present only along the transistor channel width direction, orthogonal to channel length direction 21.

Figure 1A:
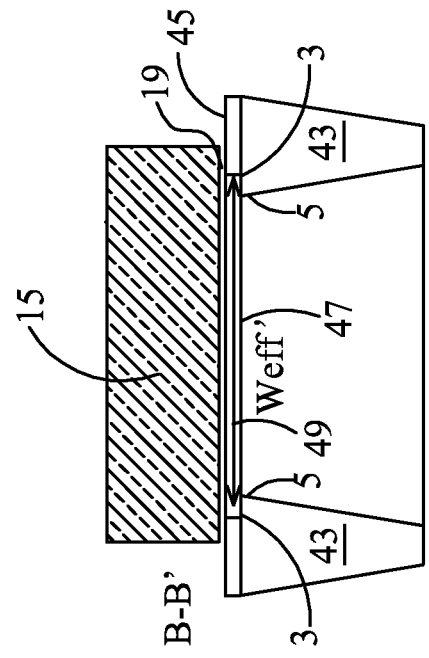
FIG. 1A is a cross-sectional view taken along line 1A-1A of FIG. 1

Now referring to FIG. 1A as well as FIG. 1, transistor 25 includes gate electrode 15, spacers 17, gate dielectric 29 and is formed over substrate 27. Substrate 27 is a semiconductor material and may be silicon according to one exemplary embodiment, although other suitable semiconductor materials may be used as substrate 27 in other exemplary embodiments. Transistor 25 includes source/drain regions 33 which are formed in substrate 27 and also in silicon layer 35. Silicon layer 35 is advantageously an epitaxially formed silicon layer and is undoped at deposition. Transistor channel 39 is disposed directly underneath gate electrode 15. Silicon layer 35 includes edge portions 7 that extend over ledges 41 of STI structures 43 and provide a T-shaped cross-section to the transistor substructure. STI structures 43 each include a plateau with top surface 45 which is substantially co-planar with the upper surface of silicon layer 35 in the exemplary embodiment illustrated in FIGS. 1A and 1B. Boundaries 3 represent the intersection between top surface 45 of STI structure 43 and silicon layer 35. Channel dopant impurity region 73 is formed within substrate 27 including in transistor channel 39. Concentrated dopant impurity regions 49 may be formed using angled ion implantation techniques such as halo implantation, and advantageously improve short channel effects for short gate lengths. Concentrated dopant impurity regions 49 may include a greater concentration of the dopant impurity present in channel dopant impurity region 73. The gate length is the dimension underneath gate electrode 15 along channel length direction 21. Gate length may range from about 10-50 nanometers according to various exemplary embodiments and may be about 30 nm in one exemplary embodiment.

Figure 1B:
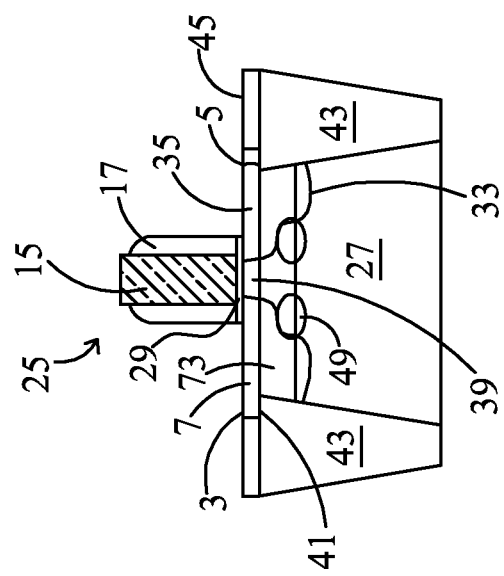
FIG. 1B is a cross-sectional view taken along line 1B-1B of FIG. 1.

FIG. 1B is a cross-sectional view taken along line 1B-1B of FIG. 1 and shows the width of the transistor channel. The effective width, Weff 49, extends from one boundary 3 to the opposed boundary 3 and is greater than a channel width extending from one inner edge 5 to the opposed inner edge 5, the width of original substrate surface 47 beneath silicon layer 35. In one exemplary embodiment, Weff 49 may be 5-10% greater than the effective channel width that extends from inner edge 5 to opposed inner edge 5. Weff 49 may be about 0.2 microns and may range from about 180-270 nanometers in various exemplary embodiments.

Figure 2A:
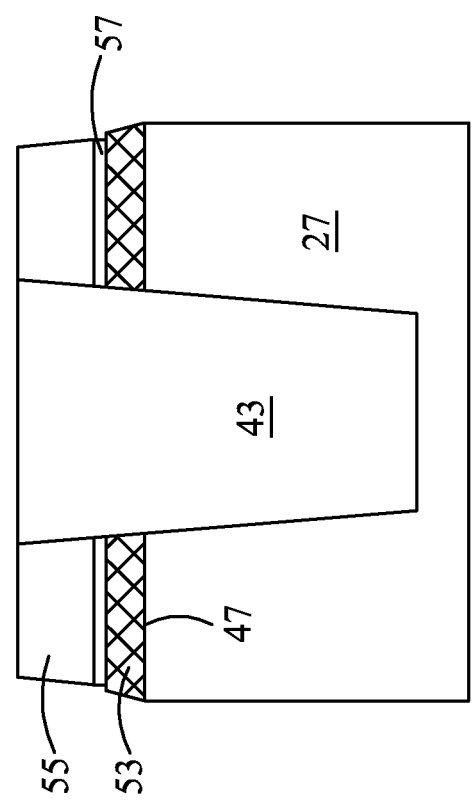
FIGS. 2A-2D are cross-sectional views showing a sequence of processing operations used to form an exemplary terraced STI structure according to the disclosure.

FIG. 2A shows STI structure 43 formed within semiconductor substrate 27. STI structure 43 may be formed using various known and future developed means. Nitride layers 53 and 55 are formed over substrate surface 47 and oxide layer 57 is interposed between nitride layers 53 and 55. Various nitride materials and oxide materials may be used and various thicknesses may be used. A nitride removal operation is used to remove nitride layer 55 and produce the structure shown in FIG. 2B. Various conventional wet or other etches may be used.

Figure 2B:
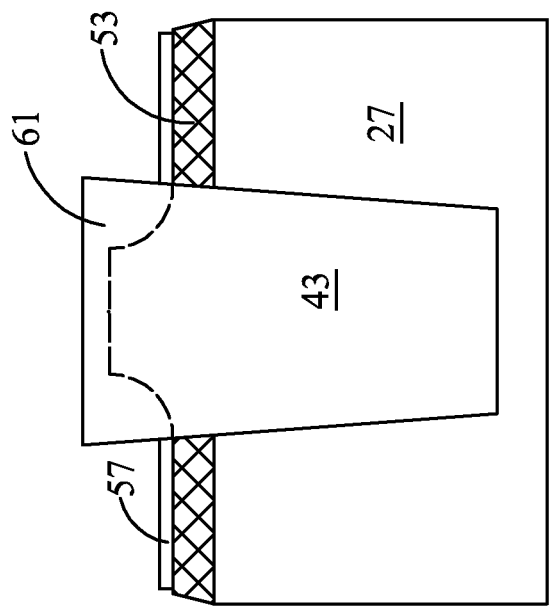
Figure 2C:
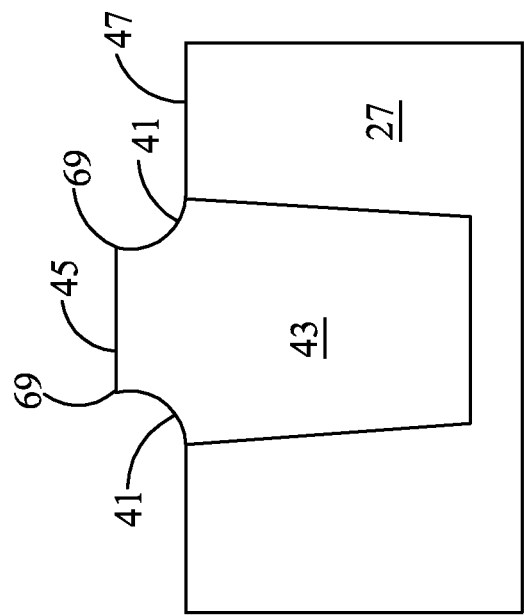

FIG. 2C shows the structure of FIG. 2B after an isotropic oxide removal operation has been used to remove oxide layer 57 and portions 61 of STI structure 43 (see FIG. 2B) to produce STI structure 43 with a terraced configuration. Various wet oxide etching operations may be used.

Figure 2D:
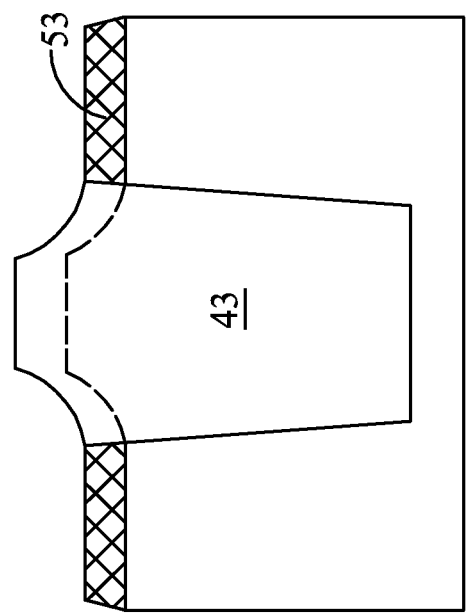

A nitride etching operation is performed upon the structure shown in FIG. 2C to remove nitride layer 53 and is followed by an oxide dip, i.e. etching operation to remove some oxide and produce the structure shown in FIG. 2D in which STI structure 43 has a central plateau that includes top surface 45 disposed above substrate surface 47 of substrate 27. STI structure 43 includes a terraced structure with ledges 41 that extend outwardly past plateau edges 69 of top surface 45. The rounded nature of the profile of terraced STI structure 43 between ledge 41 and the central plateau with top surface 45, is exemplary and ledge 41 may be characterized by a sharper inner edge profile in other exemplary embodiments such as in FIG. 3A.

Figure 3B:
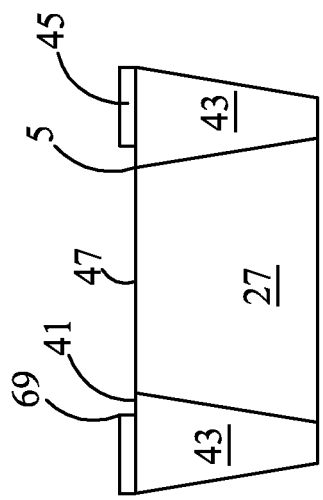
FIGS. 3A-3D are cross-sectional views showing an exemplary method for forming a MOSFET according to the disclosure.
Figure 3A:
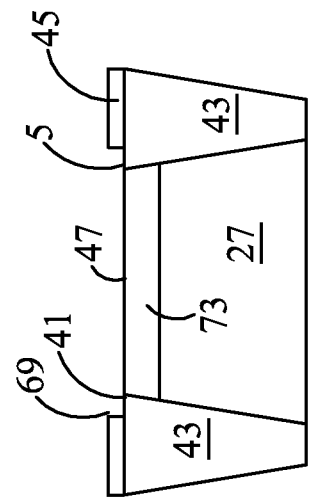

FIG. 3A shows a portion of substrate 27 disposed between two opposed terraced STI structures 43. STI structures 43 include top surface 45 with plateau edges 69 and inwardly facing ledges 41 that terminate at inner edges 5. A channel implantation operation may be carried out upon the structure shown in FIG. 3A to produce the structure shown in FIG. 3B which includes channel dopant impurity region 73. A channel implantation operation utilizing a comparatively low energy, for example, an energy that may be about 10-30 KeV may be used according to one exemplary embodiment. The channel ion implantation operation introduces dopant impurities through substrate surface 47 and into substrate 27. The channel ion implantation operation may be used to introduce N-type dopant impurities according to one exemplary embodiment or P-type dopant impurities according to another exemplary embodiment. According to one exemplary embodiment, a $BF_2$ species may be implanted using an implantation energy of about 5-15 KeV to produce the channel dopant impurity region 73 having boron as the dopant impurity. According to another exemplary, PMOS, embodiment As may be the channel dopant impurity species but other n-type or p-type channel dopant impurity species may be used in other exemplary embodiments. Channel dopant impurity region 73 may include various concentrations of dopant impurities therein.

Figure 3D:
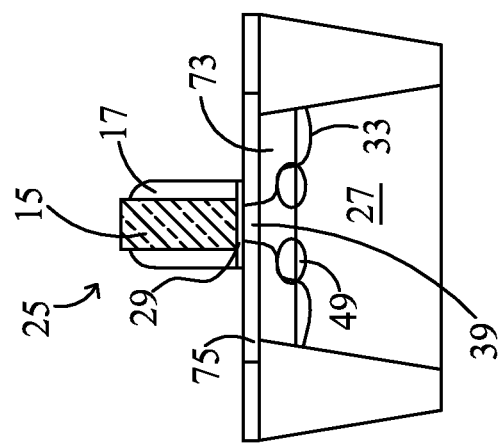
Figure 3C:
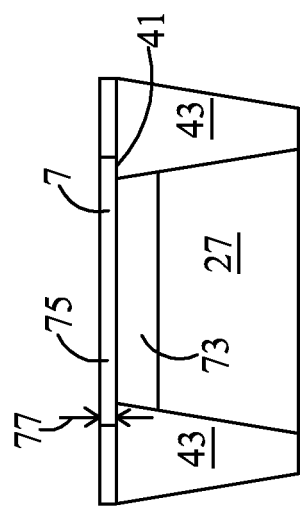

An epitaxial silicon growth operation is then performed upon the structure shown in FIG. 3B to produce the structure shown in FIG. 3C. The structure of FIG. 3C includes substrate 27 with channel dopant impurity region 73 and epitaxial silicon layer 75. Epitaxial silicon layer 75 may include a thickness 77 ranging from about 10-20 nanometers in various exemplary embodiments and grows laterally past inner edges 5 and over ledges 41 as shown in the exemplary embodiment, to produce edge portion 7 which may include a width of about 5-10 nanometers in various exemplary embodiments. Various suitable conditions for the epitaxial growth of silicon may be used to form epitaxial silicon layer 75. It can be seen that, as deposited, epitaxial silicon layer 75 does not include the dopant impurities present in channel dopant impurity region 73.

A transistor is then formed upon the structure shown in FIG. 3C to produce the structure shown in FIG. 3D. Gate electrode 15 and spacers 17 may be formed over gate dielectric 29 and conventional ion implantation and/or diffusion operations may be used to form source/drain regions 33 that are formed within both epitaxial silicon layer 75 and substrate 27. Conventional methods may be used to form source/drain regions 33. A halo or other angled ion implantation operations may be used to form concentrated dopant impurity regions 49 which may alternatively be described as a halo impurity region or a pocket impurity region. The halo ion implantation operation is a low energy, low current implantation carried out at a large incident angle so that implanted dopants penetrate underneath the edge of the gate electrode 15 to suppress punch-through effects. The halo ion or other angled ion implantation operation is used to introduce the same type dopants as within channel dopant impurity region 73 and opposite the dopant impurity type used to form source/drain regions 33. The presence of concentrated dopant impurity regions 49 improves short channel effects of transistor 25. Prior to annealing, the structure shown in FIG. 3D includes epitaxial silicon layer 75 being substantially deficient of the dopant impurities present in channel dopant impurity region 73 and in concentrated dopant impurity regions 49. In particular, transistor channel 39 of transistor 25 will include the channel dopant impurity species in channel dopant impurity region 73 within substrate 27 but the channel dopant impurity species is essentially deficient from epitaxial silicon layer 75 in transistor channel 39.

An annealing or other thermal activation operation may be then carried out to drive some of the channel dopant impurities from channel dopant impurity region 73 of substrate 27 into epitaxial silicon layer 75. Even after the annealing or other thermal activation operation is carried out, the concentration of the channel dopant impurity species is reduced and comparatively less at the interface between transistor channel 39 and gate dielectric 29 than the dopant concentration of the channel dopant impurity species as the depth into substrate 27 increases. The concentration of the dopant impurity species is greater in substrate 27 than in epitaxial silicon layer 75, in transistor channel 39.

Figure 4:
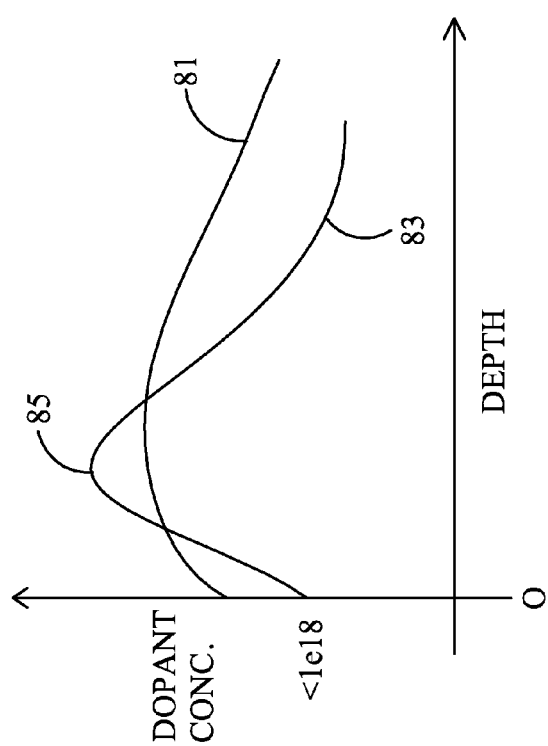
FIG. 4 is a graphical representation of a dopant impurity profile in the channel region of an exemplary MOSFET.

FIG. 4 is a graphical representation showing the profile of the dopant concentration of the channel dopant impurity species within transistor channel 39 as a function of depth into substrate 27. At depth=0, representing the top surface of transistor channel 39 and its intersection with gate dielectric 29, the concentration is minimal and in the exemplary embodiment is shown to be less than 1e18. This is intended to be exemplary only and various other dopant concentrations and profiles may be achieved in other exemplary embodiments. FIG. 4 is presented to illustrate that dopant profile 83 according to the present disclosure differs from conventional dopant profile 81 in that the concentration of the channel dopant impurity species is less at depth=0 of transistor channel 39. Curve maxima 85 of dopant profile 83 resides in substrate 27 portion of transistor channel, further showing that dopant impurity concentration is greater in substrate 27 than in epitaxial silicon layer 75.

According to one aspect, the disclosure provides a semiconductor device comprising a transistor area formed on a semiconductor substrate and comprising a silicon layer disposed on the semiconductor substrate and having at least opposed edges that extend over a ledge of a corresponding STI, shallow trench isolation, structure and are bounded by a top surface of the corresponding STI structure; and a transistor. The transistor includes source/drain regions formed in the silicon layer and in the semiconductor substrate and a gate disposed over the silicon layer including over the opposed edges.

According to one aspect, the disclosure provides a semiconductor device comprising a transistor area formed on a semiconductor substrate and defined by a first set of opposed edges and a second set of opposed edges orthogonal to the first set. Each edge is bounded by a corresponding STI, shallow trench isolation, structure. A silicon layer is disposed over the semiconductor substrate in the transistor area and including overhang portions disposed over respective inwardly facing ledges of the corresponding STI structures and edges bounded by respective top surfaces of the corresponding STI structures; and a transistor including source/drain regions is formed in the silicon layer and in the semiconductor substrate. A gate is disposed over the silicon layer including over the opposed edges.

According to yet another aspect, a method for forming a semiconductor transistor is provided. The method comprises: providing a semiconductor substrate with a substrate surface; identifying a transistor area on the semiconductor substrate having transistor area boundaries, the transistor area boundaries including at least two opposed edges; and forming a shallow trench isolation, STI, structure along each of the opposed edges, each STI structure including a central plateau including a top surface, and lower ledges that extend outwardly from the central plateau and into the transistor area. The method further comprises forming a silicon layer over the transistor area and including overhang portions disposed over the lower ledges and an upper surface bounded by the central plateau along each of the opposed edges; and forming a transistor on the silicon layer including a gate that extends from one opposed edge to the other of the opposed edges and over each of the overhang portions.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A semiconductor device comprising:
   a semiconductor substrate having at least two shallow trench isolation (STI) regions with an elemental silicon region therebetween, each STI region having a ledge, each ledge having a bottom edge coplanar with a top planar surface of the substrate, the substrate comprising a planar elemental silicon layer on the elemental silicon region, the planar elemental silicon layer having a different dopant concentration from the elemental silicon region, the elemental silicon layer having opposed edges that extend over and directly contact the ledge of a corresponding one of the at least two STI regions in overlapping relationship, a top surface of the elemental silicon layer coplanar with respective top surfaces of the at least two STI regions, a bottom of the elemental silicon layer extending continuously in planar form from one of the opposed edges to the other opposed edge; and
   a transistor including source/drain regions formed in the elemental silicon region and in the elemental silicon layer, and a gate disposed over the elemental silicon layer including over the opposed edges.

2. The semiconductor device as in claim 1, wherein said elemental silicon layer is bounded by a set of opposed additional edges disposed orthogonal to said opposed edges, each of said additional edges extending over an additional ledge of a corresponding additional STI region.

3. The semiconductor device as in claim 2, wherein said transistor includes a channel width direction extending from one of said opposed edges to the other of said opposed edges and a channel length direction orthogonal to said channel width direction.

4. The semiconductor device as in claim 1, wherein said STI regions include a central plateau having a top surface coplanar with a top surface of said elemental silicon layer.

5. The semiconductor device as in claim 1, wherein said transistor includes a channel formed in said semiconductor substrate and in said elemental silicon layer.

6. The semiconductor device as in claim 1, wherein said transistor includes a channel in said elemental silicon layer.

7. The semiconductor device as in claim 1, wherein said transistor includes a channel width about 10 percent greater than a distance between said ledges of said STI regions.

8. The semiconductor device as in claim 1, wherein a concentration of impurities in halo regions beneath lateral edges of the gate is greater than a concentration beneath a center of the gate.

9. A semiconductor device comprising:
a semiconductor substrate having at least two shallow trench isolation (STI) regions with a silicon region of elemental silicon therebetween, each STI region having a ledge, each ledge having a bottom edge coplanar with a top planar surface of the substrate, the substrate comprising a planar elemental silicon layer on the silicon region, the planar elemental silicon layer having a different dopant concentration from the silicon region, the elemental silicon layer having opposed edges in a gate width direction that extend over and directly contact the ledge of a corresponding one of the at least two STI regions in overlapping relationship, a top surface of the elemental silicon layer coplanar with the at least two STI regions, a bottom of the elemental silicon layer extending continuously in planar form from one of the opposed edges to the other opposed edge; and
a transistor including source/drain regions formed in the silicon layer and in the silicon region, and a gate disposed over the elemental silicon layer including over the opposed edges, the gate having a width in the gate width direction greater than a distance between the STI regions in the gate width direction.

10. The semiconductor device as in claim 9, wherein an effective channel width of said transistor is about 10% greater than a distance between said ledges along said gate.

11. The semiconductor device as in claim 9, wherein an effective channel width of said transistor includes a width of said elemental silicon layer extending over the ledges of the at least two STI regions.

12. The semiconductor device as in claim 9, wherein said transistor has a channel doped with boron.

13. A semiconductor device comprising:
an elemental silicon substrate having a transistor area with edges, each edge adjacent a corresponding shallow trench isolation (STI) structure, each STI structure having an inwardly facing ledge, each ledge having a bottom edge coplanar with a top planar surface of the substrate;
an elemental silicon layer disposed on the silicon substrate in the transistor area and including portions overlying and directly contacting respective ledges of the corresponding STI structures in overlapping relationship, the elemental silicon layer being coplanar with a top surface of the STI structures, a bottom of the elemental silicon layer extending continuously in planar form from one of the ledges to the other ledge; and
a transistor including source/drain regions formed in the silicon layer and in the silicon substrate, a gate disposed over the silicon layer including over the edges, and a channel region disposed beneath the gate, a dopant impurity concentration of the channel region in the silicon layer being less than a dopant impurity concentration of the channel region in the silicon substrate.

14. The semiconductor device as in claim 13, wherein said elemental silicon layer is bounded by a set of additional edges orthogonal to said edges, each of said additional edges extending over an additional ledge of a corresponding additional STI structure.

15. The semiconductor device as in claim 14, wherein said transistor includes a channel width direction extending from one of said edges to the other of said edges and a channel length direction orthogonal to said channel width direction.

16. The semiconductor device as in claim 13, wherein said STI structures include a central plateau having a top surface coplanar with a top surface of said elemental silicon layer.

17. The semiconductor device as in claim 13, wherein said transistor includes a channel formed in said silicon substrate and in said elemental silicon layer.

18. The semiconductor device as in claim 13, wherein said transistor includes a channel in said elemental silicon layer.

19. The semiconductor device as in claim 13, wherein said transistor includes a channel width about 10 percent greater than a distance between said ledges of said STI structures.

20. The semiconductor device as in claim 13, wherein a concentration of impurities in halo regions beneath lateral edges of the gate is greater than a concentration beneath a center of the gate.

* * * * *